(12) United States Patent
Ogata et al.

(10) Patent No.: US 6,323,098 B1
(45) Date of Patent: Nov. 27, 2001

(54) MANUFACTURING METHOD OF A SEMICONDUCTOR DEVICE

(75) Inventors: Tamotsu Ogata; Junichi Tsuchimoto; Yutaka Inaba; Kiyoshi Mori, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/261,159

(22) Filed: Mar. 3, 1999

(30) Foreign Application Priority Data

Sep. 11, 1998 (JP) .................................................. 10-258332

(51) Int. Cl.[7] .................................................. H01L 21/20
(52) U.S. Cl. ............................................. 438/396; 438/765
(58) Field of Search .................................. 438/396, 773, 438/FOR 220, 765

(56) References Cited

U.S. PATENT DOCUMENTS 5,371,039 * 12/1994 Oguro .
5,663,087 * 9/1997 Yokozawa .
5,917,211 * 6/1999 Murata et al. .
6,025,248 * 2/2000 Kim et al. .

FOREIGN PATENT DOCUMENTS 9-82819    3/1997  (JP) .

* cited by examiner

*Primary Examiner*—George Fourson
*Assistant Examiner*—Michelle Estrada
(74) *Attorney, Agent, or Firm*—McDermott, Will & Emery

(57) ABSTRACT

After a bottom electrode 30 of a capacitor is formed, a nitride film as an insulating film 32 of the capacitor is formed on the bottom electrode 30 by CVD. Then, the insulating film 32 is wet-oxidized at a temperature in a range of 700° C. to 760° C. Finally, a top electrode 34 of the capacitor is formed on the insulating film 32. The insulating film 32 forming step includes a substep of increasing the temperature of a silicon wafer to a CVD reaction temperature in an ammonia atmosphere.

4 Claims, 6 Drawing Sheets

MANUFACTURING METHOD OF A SEMICONDUCTOR DEVICE

BACKGROUND OF THE INVENTION

1. Field of the Invention

The present invention relates to a manufacturing method of a semiconductor device and, more specifically, to a manufacturing method of a semiconductor device that is suitable for miniaturization of a semiconductor device having a capacitor.

2. Description of the Background Art

Figure 7:
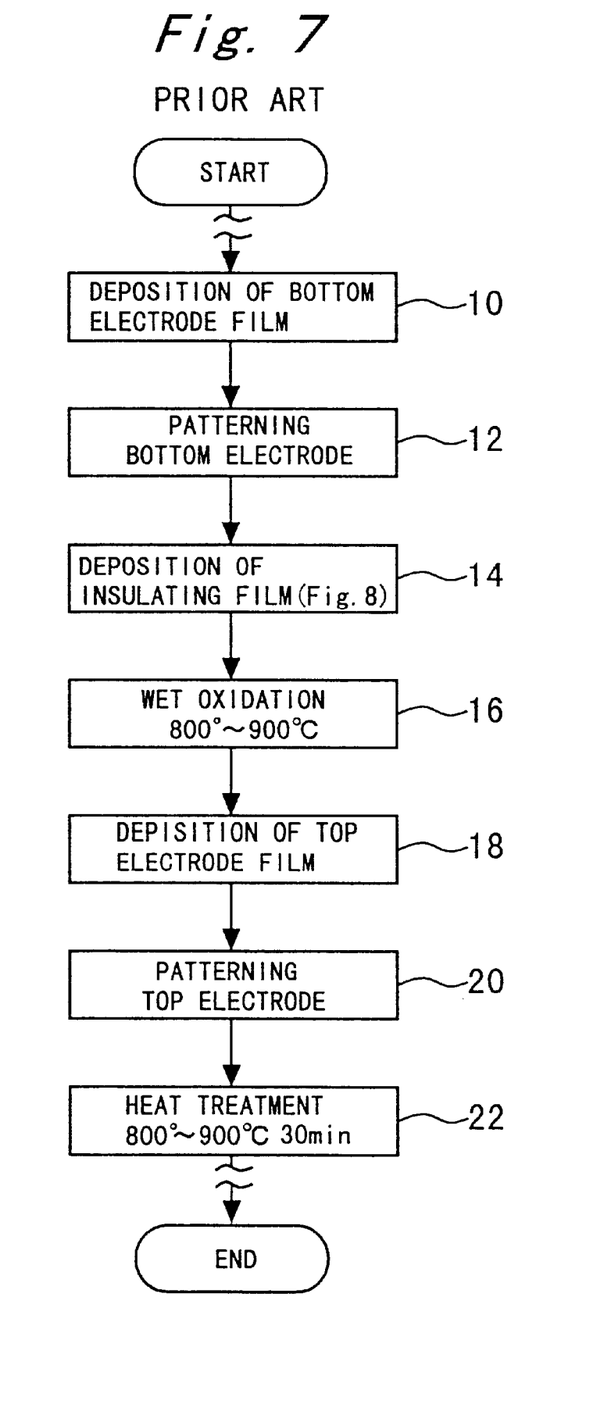
FIG. 7 is a flowchart for describing a former manufacturing method of a semiconductor device.

FIG. 7 is a flowchart showing a former manufacturing method of a semiconductor device having a capacitor. In this former manufacturing method, first, a capacitor bottom electrode film is formed on a silicon wafer (step 10). Specifically, polysilicon containing phosphorus as an impurity is deposited on the silicon wafer by CVD.

Then, a bottom electrode of a capacitor is formed by properly patterning the bottom electrode film by photolithography and dry etching (step 12).

Then, a nitride film as an insulating film of the capacitor is formed on the bottom electrode (step 14). Specifically, the nitride film is deposited on the bottom electrode by CVD by using dichlorosilane ($SiH_2Cl_2$) and ammonia ($NH_3$) as materials.

Figure 8:
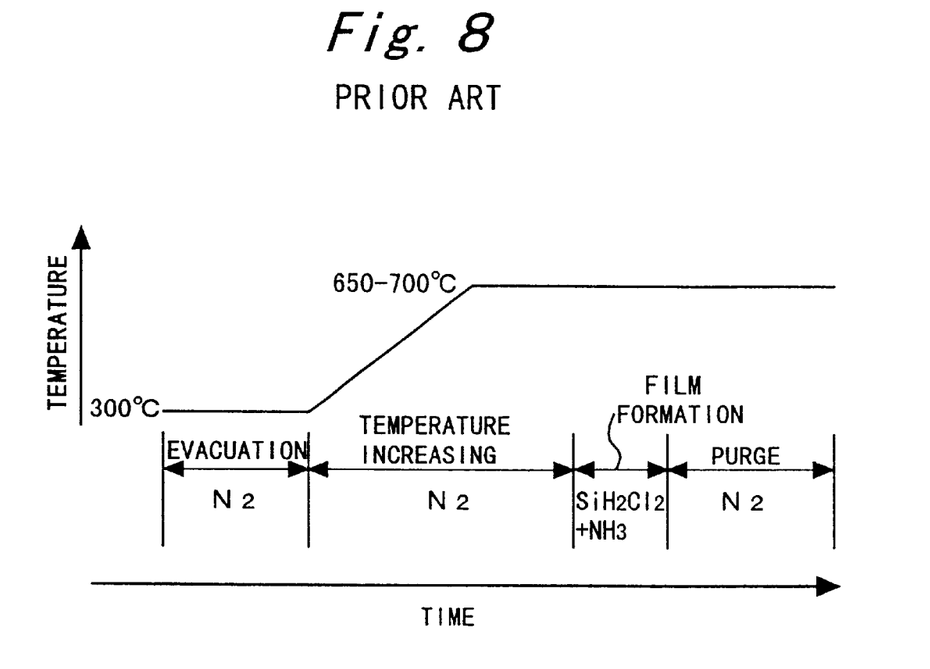
FIG. 8 shows a series of processes that are executed in a insulating film formation step in the former manufacturing method.

FIG. 8 shows a series of processes that are executed in the insulating film (nitride film) deposition step. As shown in FIG. 8, in this step, evacuation of a reaction furnace, increasing of silicon wafer temperature, formation of a nitride film by CVD, and a purge are performed consecutively. In the former manufacturing method, the evacuation, the temperature increasing, and the purge are performed in a nitrogen atmosphere.

Upon completion of the insulating film formation, wet oxidation is performed on the surface of the insulating film (step 16). This step is intended to repair defects that are included in the nitride film (insulating film) to thereby improve the electrical characteristics of the capacitor and increase its reliability. In the former manufacturing method, the wet oxidation is performed by heating the silicon wafer at 800° C.–900° C. in water vapor that is obtained by mixing hydrogen and oxygen.

To activate the impurity that is contained in the bottom electrode, it is necessary to subject the silicon wafer to a heat treatment. In the former manufacturing method, the impurity in the bottom electrode can be activated by heat that is applied to the silicon wafer during the above wet oxidation.

After completion of the wet oxidation of the insulating film, a top electrode film is formed on the insulating film (step 18). In the former manufacturing method, the top electrode film is formed by depositing polysilicon that contains phosphorus at a concentration of about $5 \times 10^{20}$ atoms/cm$^3$.

The thus-formed top electrode film is then patterned properly by photolithography and dry etching into a top electrode of the capacitor (step 20).

Then, to sufficiently activate the impurities contained in the top and bottom electrodes, a heat treatment is performed on the silicon wafer at 800° C.–900° C. for about 30 minutes (step 22).

However, in semiconductor devices, there may occur a case that capacitors are manufactured after forming transistors on a silicon wafer. In such a situation, there may occur an event that when the above-described wet oxidation (step 16) and heat treatment (step 22) are performed in manufacturing capacitors, heat that is applied to transistors and their vicinities causes diffusion of impurities that are implanted in various parts of the transistors. In particular, if the size of the transistors is enough small, i.e., if the semiconductor device is sufficiently miniaturized, the diffusion may disable normal operation of the transistors.

In such semiconductor devices as a memory equipped with a logic circuit, one method of increasing the operation speed is to form a metal wiring (word lines and bit lines) under capacitors. In this case, if the temperature of the silicon wafer exceeds the heat resistant temperature of the metal wiring in manufacturing the capacitors, defects may occur in the metal wiring to render the semiconductor device inoperative.

For the above reasons, to miniaturize a semiconductor device or increase its operation speed, it is desirable that heat treatments in a capacitor manufacturing process be performed at as low a temperature as possible. In this respect, former manufacturing methods of a semiconductor device still have room for improvement.

SUMMARY OF THE INVENTION

The present invention has been conceived to solve the previously-mentioned problems, and a general object of the present invention is to provide a novel and useful manufacturing method of a semiconductor device having a capacitor.

A more specific object of the present invention is to provide a manufacturing method which can reduce the temperatures of heat treatments that are necessary for formation of a capacitor without impairing its characteristics.

The above object of the present invention is achieved by a manufacturing method having the steps described below. The method have a step for forming a bottom electrode of the capacitor and a step for forming a nitride film as an insulating film of the capacitor on the bottom electrode by CVD. The nitride film forming step includes the substep of increasing a temperature of a silicon wafer to a CVD reaction temperature in an ammonia atmosphere. The method also has a step for wet-oxidizing the insulating film at a temperature in a range of 700° C. to 760° C. The method further has a step for forming a top electrode of the capacitor on the insulating film.

The above object of the present invention is also achieved by a manufacturing method having the steps described below. The method includes a step for forming a bottom electrode of the capacitor and a step for forming a nitride film as an insulating film of the capacitor on the bottom electrode by CVD. The method also includes a step for performing annealing at a temperature in a range of 700° C. to 760° C. in an atmosphere containing an $N_2O$ gas after formation of the insulating film. The method further includes a step for forming a top electrode of the capacitor on the insulating film.

The above object of the present invention is also achieved by a manufacturing method having the steps described below. The method includes a step for forming a bottom electrode of the capacitor and a step for forming an insulating film of the capacitor on the bottom electrode. The method also includes a step for depositing, on the insulating film, an amorphous silicon film containing phosphorus at a concentration of $8 \times 10^{20}$ atoms/cm$^3$ or more as a film for forming an insulating film of the capacitor. The method further includes a step for performing rapid thermal annealing at a temperature close to 750° C. for a period in a range of 1 to 3 minutes after deposition of the amorphous silicon film.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings. The members and manufacturing steps that are common to some of the drawings are given the same reference numerals and redundant descriptions therefor may be omitted.

Figure 1:
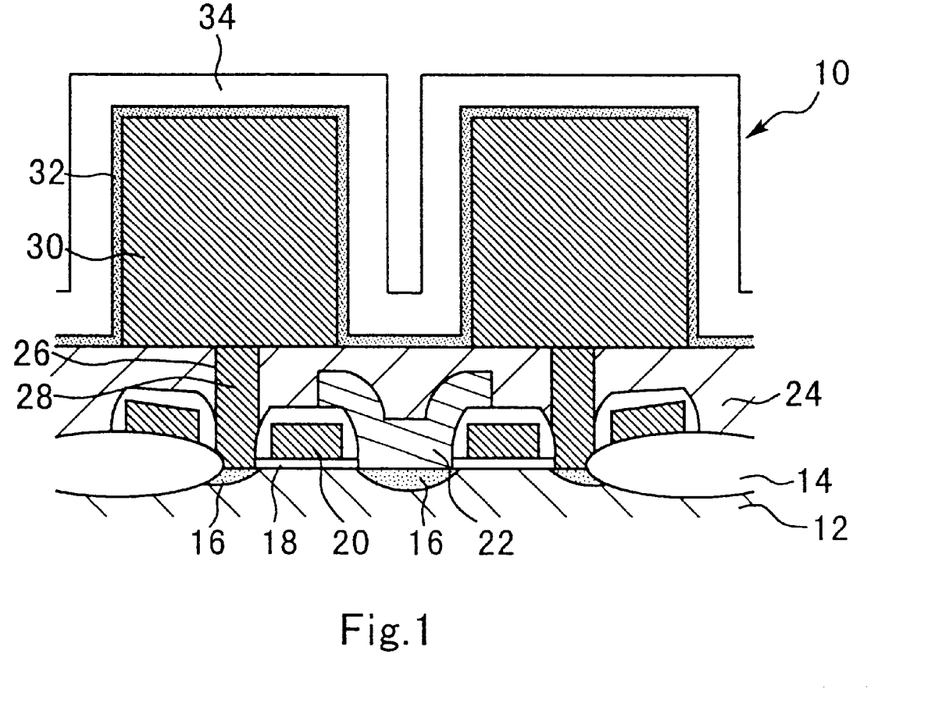
FIG. 1 is a sectional view showing the main part of a semiconductor device that has been manufactured by a manufacturing method according to a first embodiment of the present invention.

FIG. 1 is a sectional view showing the main part of a semiconductor device 10 that has been manufactured by a manufacturing method according to an embodiment of the present invention. As shown in FIG. 1, the semiconductor device 10 has a silicon substrate 12. The silicon substrate 12 is provided with isolation oxide films 14 for dividing the surface area of the silicon substrate 12 into a plurality of regions, and diffusion layers 16 that function as the source or the drain of a transistor.

A gate oxide film 18, a word line 20, a data line 22, and other elements are formed on the silicon substrate 12. An interlayer insulating film 24 is formed on the above elements. A contact hole 26 is formed through the interlayer insulating film 24 so as to communicate with one of the diffusion layers 16 of the silicon substrate 12. A contact 28, which is made of a conductive material such as doped polysilicon, is formed in the contact hole 26.

A bottom electrode 30 is formed on the interlayer insulating film 24 so as to be electrically connected to the contact 28. The bottom electrode 30 is made of doped polysilicon containing phosphorus at a predetermined concentration. The surface of the bottom electrode 30 is covered with an insulating film 32, which is a silicon nitride film. A top electrode 34 is formed on the insulating film 32. The bottom electrode 30, the insulating film 32, and the top electrode 34 constitute a capacitor incorporated in the semiconductor device 10.

As described later, a process of forming the bottom electrode 30, the insulating film 32, and the top electrode 34 (i.e., capacitor forming process) includes steps in which the silicon wafer is heated to a high temperature. If the silicon wafer is heated to a high temperature, the impurities contained in the diffusion layers 16 and the channel region of the silicon substrate 12 may diffuse to change the characteristics of the transistor. Therefore, it is desirable that the temperatures of the heat treatments performed on the silicon substrate 12 in manufacturing the capacitor be as low as possible. The manufacturing method of this embodiment is characterized in that it can reduce the temperatures of the heat treatments that are performed in manufacturing the capacitor without impairing the characteristics of the capacitor.

The details of the manufacturing method according to the first embodiment will be described below with reference to FIGS. 2 to 6.

Figure 2:
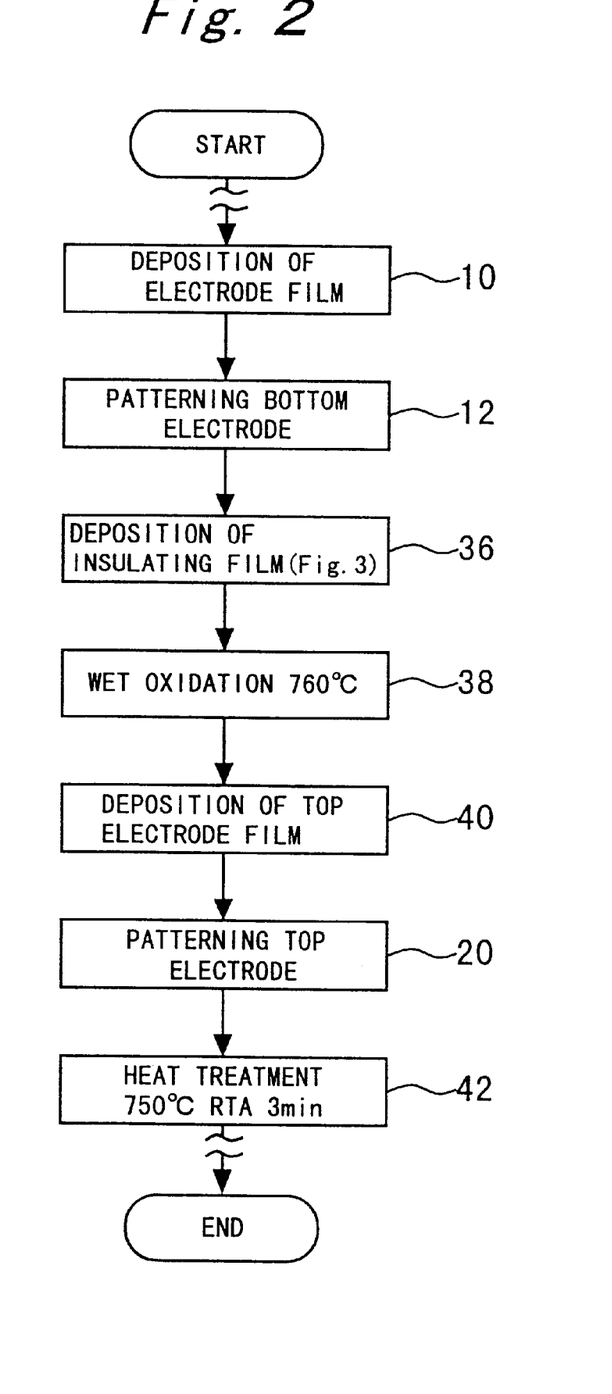
FIG. 2 is a flowchart for describing the manufacturing method according to the first embodiment of the present invention.

FIG. 2 is a flowchart showing the main part of the manufacturing method of the semiconductor device 10 according to the embodiment. In the manufacturing method of this embodiment, a capacitor is manufactured through execution of a series of steps shown in FIG. 2.

In the series of steps shown in FIG. 2, first, a capacitor bottom electrode film is formed on an interlayer insulating film 24 (step 10). Specifically, in this step 10, polysilicon containing phosphorus as an impurity is deposited on a silicon wafer by CVD.

Then, a bottom electrode 30 of a capacitor is formed by properly patterning the bottom electrode film by photolithography and dry etching (step 12).

A nitride film as an insulating film 32 of the capacitor is formed on the bottom electrode 30 (step 36). More particularly, in this step 36, the insulating film 32 is deposited by CVD using dichlorosilane ($SiH_2Cl_2$) and ammonia ($NH_3$) as materials.

Figure 3:
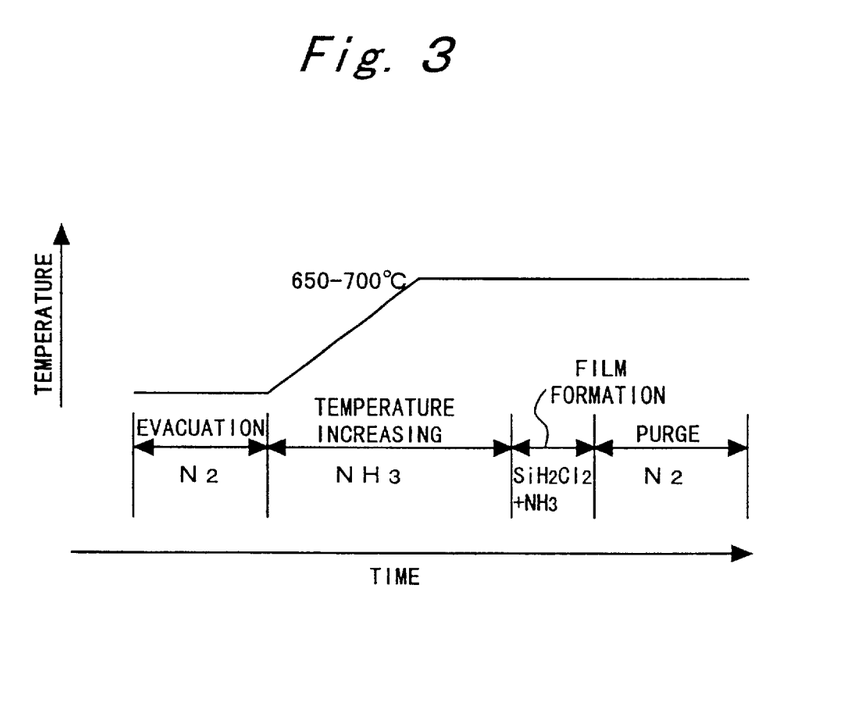
FIG. 3 shows a series of processes that are executed in a insulating film formation step in the manufacturing method according to the first embodiment of the present invention.

FIG. 3 shows a series of processes that are executed in the insulating film 32 (nitride film) deposition step. As shown in FIG. 3, in the step for forming the insulating film 32, evacuation of a reaction furnace, increasing of silicon wafer temperature, formation of a nitride film by CVD, and a purge are performed consecutively. In the manufacturing method of the first embodiment, among these processes, the process of increasing the silicon wafer temperature is executed in an ammonia ($NH_3$) atmosphere of about 0.4 Torr.

Upon completion of the formation of the insulating film 32, wet oxidation is performed on the surface of the insulating film 32 (step 38). This step is intended to repair defects that are included in the nitride film (insulating film 32) to thereby improve the electrical characteristics of the capacitor and increase its reliability. In the first embodiment, the wet oxidation is performed by keeping, for 60 minutes, the silicon wafer in the furnace in which the temperature is adjusted in a range of about 700° C.–760° C. and that is filled with water vapor that is obtained by mixing hydrogen and oxygen at a flow rate ratio of 1.8:1 to 1:6.

The above-mentioned temperature (700° C.–760° C.) of the wet oxidation is sufficiently lower than the temperature (800° C.–900° C.) used in the former manufacturing method. Therefore, the manufacturing method according to the first embodiment can make the thermal effect that is exerted on the silicon wafer in the capacitor manufacturing process lighter than the former manufacturing method. Further, the above mentioned hydrogen-to-oxygen flow rate ratio is suitable for proper oxidation of the surface of the insulating film 32. Therefore, the first embodiment can oxidize the insulating film 32 to provide a good oxidation state and hence can realize a manufacturing process that is superior to obtain a stable quality.

After completion of the wet oxidation of the insulating film 32, a top electrode film is formed on the insulating film 32 (step 40). In the first embodiment, the top electrode film is formed by depositing amorphous silicon that contains phosphorus at a concentration of about $8 \times 10^{20}$ atoms/cm$^3$ on the insulting film 32 by CVD. The phosphorus concentration ($8 \times 10^{20}$ atoms/cm$^3$) imparted to the top electrode film in the first embodiment is sufficiently higher than the phosphorus concentration ($5 \times 10^{20}$ atoms/cm$^3$) imparted to the top electrode film in the former manufacturing method.

In industrial manufacture of semiconductor devices, it is sometimes necessary to form top electrode films simultaneously on more than 100 silicon wafers by using a batch CVD furnace. In such a case, it is difficult to obtain a phosphorus concentration that is as high as $8 \times 10^{20}$ atoms/cm$^3$ as long as the top electrode film is formed by depositing doped polysilicon. In contrast, such a high phosphorus concentration can be obtained by depositing amorphous silicon film as in the case of the first embodiment.

The thus-formed top electrode film is then patterned properly by photolithography and dry etching into a top electrode 34 of the capacitor (step 20).

Then, to activate the impurities contained in the top electrode 34 and the bottom electrode 30, a heat treatment is performed on the silicon wafer. In the manufacturing method according to the first embodiment, RTA (rapid thermal annealing) is executed as the heat treatment. Specifically, the RTA is performed at about 750° C. for about 1 to 3 minutes in an N$_2$ atmosphere in the first embodiment (step 42). These heat treatment conditions can make the thermal effect exerted on the silicon wafer sufficiently lighter than can the heat treatment conditions (800° C.–900° C., 30 minutes) of the former manufacturing method.

Figure 4:
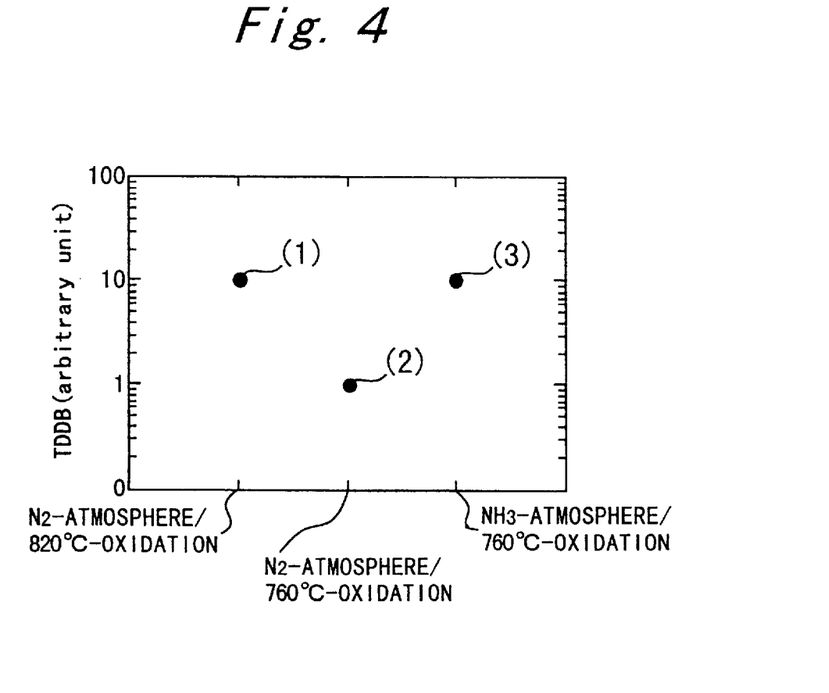
FIG. 4 shows a relationship between a manufacturing condition of a capacitor and the TDDB life of the same.

FIG. 4 shows a relationship between the semiconductor device manufacturing conditions and the TDDB life of a capacitor. A point indicated by numeral (1) in FIG. 4 represents a result that was obtained when the formation of the insulating film 32 was executed under the former conditions, i.e., when the process of increasing the silicon wafer temperature to the CVD reaction temperature was executed in an N$_2$ atmosphere as well as the wet oxidation of the insulating film 32 was performed at 820° C. A point indicated by numeral (2) in FIG. 4 represents a result that was obtained in such a manner that the silicon wafer temperature was increased in an N$_2$ atmosphere and the wet oxidation was performed at 760° C. A point indicated by numeral (3) in FIG. 4 represents a result that was obtained under the conditions of the first embodiment, i.e., under the condition that the silicon wafer temperature was increased in an NH$_3$ atmosphere (step 36) and the wet oxidation was performed at 760° C. (step 38).

As seen from the results (1) and (2), when the temperature of the silicon wafer is increased in an N$_2$ atmosphere, the TDDB life shortens by a factor of about 10 as the wet oxidation temperature decreases from 820° C. to 760° C. In contrast, as seen from the results (1)–(3), by changing the atmosphere in which the silicon wafer temperature increases from N$_2$ to NH$_3$, the TDDB life equivalent to that obtained when the wet oxidation temperature is 820° C. can be obtained even when it is 760° C.

As described above, by increasing the silicon wafer temperature in an NH$_3$ atmosphere during the formation of the insulating film 32, a sufficiently long TDDB life can be given to the capacitor even if the wet oxidation temperature is lowered. Further, it has been confirmed experimentally that as long as the silicon wafer temperature is increased in an NH$_3$ atmosphere, a sufficiently long TDDB life of the capacitor can be secured even if the wet oxidation temperature is lowered to about 700° C.

In the manufacturing method according to the first embodiment, as mentioned above, the silicon wafer temperature is increased in an NH$_3$ atmosphere in the step of forming the insulating film 32 as well as the wet oxidation of the insulating film 32 is performed in the temperature range of 700° C.–760° C. Therefore, the first embodiment enables manufacture of a capacitor having a sufficiently long TDDB life while sufficiently lowering the wet oxidation temperature. Therefore, the first embodiment enables formation of a capacitor that is highly reliable and durable while reducing the thermal damages on various members of the semiconductor device 10.

In the manufacturing method according to the first embodiment, the top electrode 34 is an n-type semiconductor containing phosphorus as an impurity. Therefore, where the negative potential is given to the top electrode 34, a depletion layer never occurs at the boundary between the insulating film 32 and the top electrode 34 irrespective of the concentration of activated impurities. On the other hand, where a positive potential is applied to the top electrode 34, a depletion layer may occur at the boundary between the insulating film 32 and the top electrode 34 if the concentration of activated impurities is low. When a depletion layer is generated at the boundary between the insulating film 32 and the top electrode 34, the utilization efficiency of the capacitor decreases. Thus, to use the capacitor at high utilization efficiency, it is necessary that activated impurities exist at a high concentration in the top electrode 34.

Figure 5:
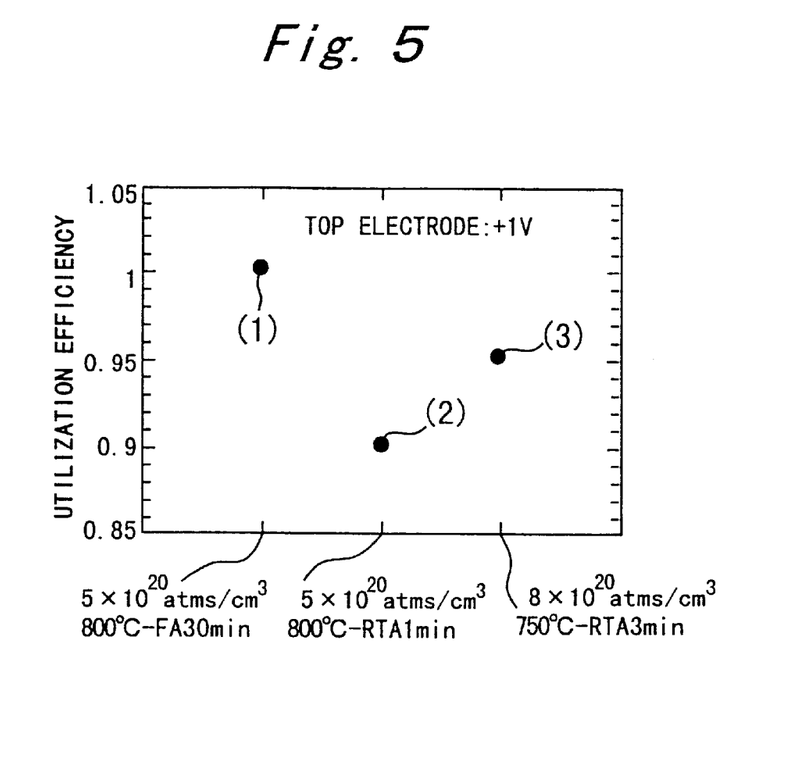
FIG. 5 shows a relationship between a manufacturing condition of a capacitor and the utilization efficiency of the same.

FIG. 5 shows a relationship between the semiconductor device manufacturing conditions and the utilization efficiency of a capacitor. The relationship shown in FIG. 5 was obtained under a condition that +1 V was applied to the top electrode 34, that is, under such a condition that the utilization efficiency of the capacitor is mainly determined by the concentration of activated impurities in the top electrode 34. A point indicated by numeral (1) in FIG. 5 represents a result obtained under the former conditions that the phosphorus concentration of the top electrode 34 was $5 \times 10^{20}$ atoms/cm$^3$ as well as the heat treatment for activating the impurity in the top electrode 34 was FA (furnace annealing) of 800° C. for 30 minutes. A point indicated by numeral (2) in FIG. 5 represents a result obtained in such a manner that the phosphorus concentration of the top electrode 34 was $5 \times 10^{20}$ atoms/cm$^3$ and the heat treatment for activating the impurity in the top electrode 34 was RTA of 800° C. for 1 minute. A point indicated by numeral (3) in FIG. 5 represents a result obtained under the conditions of the first embodiment that the phosphorus concentration of the top electrode 34 was $8 \times 10^{20}$ atoms/cm$^3$ and the heat treatment for activating the impurity in the top electrode 34 was RTA of 750° C. for 3 minute.

As seen from the results (1) and (2), where the phosphorus concentration of the top electrode 34 was $5 \times 10^{20}$ atoms/cm$^3$, the utilization efficiency of the capacitor decreases by about 10% as the heat treatment method is changed from FA (30 minutes) to RTA (1 minute) even if the heat treatment temperature is the same (800° C.). On the other hand, as seen from the results (1) and (3), by setting the phosphorus concentration of the top electrode 34 at $8 \times 10^{20}$ atoms/cm$^3$ the reduction in the utilization efficiency of the capacitor can be made as small as about 5% even if the heat treatment method is changed from FA (30 minutes) to RTA (3 minute) and the heat treatment temperature is lowered from 800° C. to 750° C.

Figure 6:
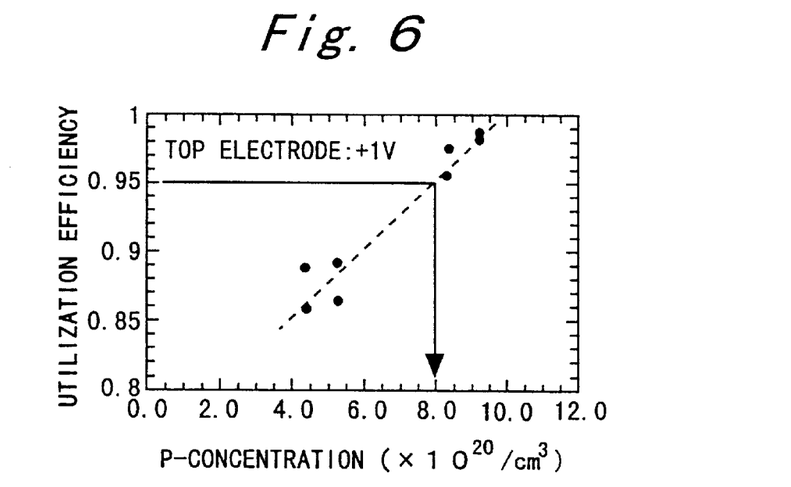
FIG. 6 shows a relationship between phosphorus concentration of a top electrode of a capacitor and utilization efficiency of the capacitor.

FIG. 6 shows a relationship between the phosphorus concentration of the top electrode 34 and the utilization efficiency of a capacitor. The relationship of FIG. 6 was obtained when the heat treatment was performed under the conditions of 750° C., RTA, and 3 minutes. Each of the capacitor utilization efficiency values shown in FIG. 6 is a ratio calculated through use of the capacitance as a reference that was obtained by the former manufacturing method. As seen from FIG. 6, in a case where the heat treatment of the top electrode 34 is performed under the above conditions (i.e., the conditions of the first embodiment), the capacitor utilization efficiency is approximately in proportion to the phosphorus concentration. The results of FIG. 6 also indicate that when the phosphorus concentration is $8 \times 10^{20}$ atoms/cm$^3$ or more, a capacitor having 95% or more utilization efficiency with regard to the capacitor manufactured by the former manufacturing method can always obtained.

As described above, as long as the phosphorus concentration of the top electrode 34 is set at $8 \times 10^{20}$ atoms/cm$^3$ or more, the utilization efficiency equivalent to that obtained under the former heat treatment conditions can be obtained even if the heat treatment is performed at a lower temperature and for a shorter time. It has been confirmed experimentally that when the phosphorus concentration of the top electrode 34 is set at $8 \times 10^{20}$ atoms/cm$^3$ or more, a desired utilization efficiency value (95% or more of the value obtained under the former conditions) can be obtained by performing RTA at 750° C. for 1 minute or more.

In the first embodiment, phosphorus is added to the top electrode film at a concentration of $8 \times 10^{20}$ atoms/cm$^3$ in the step of depositing the top electrode film (step 40) and the ensuing heat treatment (step 42) is performed under the conditions of 750° C., RTA, and 1–3 minutes. Therefore, the first embodiment can secure sufficiently high capacitor utilization efficiency while lowering the heat treatment temperature and shortening the heat treatment time greatly. Thus, the manufacturing method according to the first embodiment enables formation of a capacitor having desired electrical characteristics while reducing the thermal damage on various members of the semiconductor device 10.

Although the surface of the bottom electrode 30 is flattened in the above embodiment, the invention is not limited to such a case. That is, for example, the bottom electrode 30 may have a rugged surface structure in which the surface of the bottom electrode 30 has asperity.

Although in the first embodiment the wet oxidation (step 38) is performed by using water vapor that is obtained by mixing hydrogen and oxygen after the formation of the insulating film 32, the wet oxidation may be replaced by annealing that is performed at 700° C.–760° C. for 60 minutes in an $N_2O$ gas atmosphere. It has been confirmed experimentally that such annealing can repair defects that are included in the insulating film 32 and thereby make the capacitor sufficiently reliable, like the case of performing the wet oxidation of step 38. In this case, it has also been confirmed experimentally that sufficiently high reliability can be obtained even if the silicon wafer temperature is increased in an $N_2$ atmosphere, rather than in an $NH_3$ atmosphere during the formation of the insulating film 32. Therefore, where the above annealing is performed instead of the wet oxidation in step 38, the silicon wafer temperature may be increased in an $N_2$ atmosphere during the formation of the insulating film 32, as in the case of the former manufacturing method.

In the first embodiment, the semiconductor device 10 has the word line 20 and the data line 22 composed of doped polysilicon. The material of the word lines 20 and 22 is not limited to doped polysilicon, and may be a metal such as tungsten, tungsten silicide, titanium nitride, or titanium. As described above, the manufacturing method according to the first embodiment can sufficiently reduce the thermal damage that is imposed on the silicon wafer in the process of manufacturing the capacitor. Therefore, the first embodiment enables formation of a capacitor without damaging the word line 20 and the data line 22 even if they are made of a metal material.

Although in the above embodiment dichlorosilane ($SiH_2Cl_2$) and ammonia ($NH_3$) are used as the materials of the nitride film as the insulating film 32, the materials of the nitride film are not limited to those. For example, the nitride film may be formed by using tetrachlorosilane ($SiCl_4$) and ammonia ($NH_3$) as materials.

The major benefits of the present invention described above are summarized as follows:

According to a first aspect of the present invention, during the formation of the insulating film, the temperature of the silicon wafer is increased to a CVD temperature in an ammonia atmosphere. In this case, a sufficiently long life of the capacitor can be secured even if the wet oxidization temperature is set as low as about 700° C.–760° C. Therefore, the present invention enables formation of a capacitor having a sufficiently long life while lowering the wet oxidization temperature.

According to a second aspect of the present invention, the wet oxidization of the insulating film is performed in a water vapor atmosphere in which the hydrogen-to-oxygen flow rate ratio is set in a range of 1.8:1 to 1:6. If the wet oxidation is performed in the above atmosphere, an oxide layer having a proper thickness can be formed on the surface of the insulating film. Therefore, the present invention enables capacitors to be formed at a high yield in such a manner that their quality is stabilized.

According to a third aspect of the present invention, annealing is performed at about 700° C.–760° C. in an $N_2O$ gas after formation of the insulating film. This annealing provides substantially the same effects as the wet oxidation. Therefore, the invention enables formation of a capacitor having a sufficiently long life while reducing the amount of heat that is applied to the silicon wafer in the process of manufacturing the capacitor.

According to a fourth aspect of the present invention, phosphorus ions are implanted into the top electrode at a concentration of $8 \times 10^{20}$ ions/cm$^3$ or more. In this case, desired electrical characteristics can be imparted to the top electrode by performing RTA at about 750° C. for 1–3 minutes. Therefore, the present invention enables capacitors having desired electrical characteristics to be manufactured at a high yield while lowering the temperature of the heat treatment of the top electrode.

According to a fifth aspect of the present invention, capacitors are manufactured in such a manner that their characteristics are stabilized while the temperature in processing the insulating film and the temperature in processing the top electrode are sufficiently lowered. Therefore, the present invention makes it possible to manufacture capacitors having desired characteristics at a high yield without imposing a heavy thermal effect on the components of a semiconductor device other than the capacitor.

Further, the present invention is not limited to these embodiments, but variations and modifications may be made without departing from the scope of the present invention.

The entire disclosure of Japanese Patent Application No. Hei 10-258332 filed on Sep. 11, 1998 including specification, claims, drawings and summary are incorporated herein by reference in its entirety.

What is claimed is:

1. A manufacturing method of a semiconductor device having a capacitor, comprising the steps of:

forming a bottom electrode of the capacitor;

forming a nitride film as an insulating film of the capacitor on the bottom electrode by CVD, the nitride film forming step comprising the substep of increasing a temperature of a silicon wafer to a CVD reaction temperature in an ammonia atmosphere;

wet-oxidizing the insulating film at a temperature in a range of 700° C. to 760° C.; and forming a top electrode of the capacitor on the insulating film.

2. The manufacturing method according to claim 1, wherein the insulating film is wet-oxidized in a water vapor atmosphere in which a hydrogen-to-oxygen flow rate ratio is in a range of 1.8:1 to 1:6.

3. The manufacturing method according to claim 1, wherein the top electrode forming step includes the substep of depositing an amorphous silicon film containing phosphorus at a concentration of $8 \times 10^{20}$ atoms/cm$^3$ or more on the insulating film, and the manufacturing method further comprising the step of performing annealing at a temperature close to 750° C. for a period in a range of 1 to 3 minutes after deposition of the amorphous silicon film.

4. The manufacturing method according to claim 2, wherein the top electrode forming step includes the substep of depositing an amorphous silicon film containing phosphorus at a concentration of $8 \times 10^{20}$ atoms/cm$^3$ or more on the insulating film, and the manufacturing method further comprising the step of performing annealing at a temperature close to 750° C. for a period in a range of 10 to 3 minutes after deposition of the amorphous silicon film.

* * * * *